United States Patent [19]

Sakaguchi et al.

[11] 4,019,070
[45] Apr. 19, 1977

[54] CIRCUIT FOR SETTING AN INITIAL STATE AFTER CONNECTION OF A POWER SUPPLY

[75] Inventors: Jiroh Sakaguchi, Kokubunji; Hiroto Kawagoe, Kodaira, both of Japan

[73] Assignee: Hitachi, Ltd., Japan

[22] Filed: Dec. 30, 1975

[21] Appl. No.: 645,342

[30] Foreign Application Priority Data

Jan. 6, 1975   Japan .................................. 50-109

[52] U.S. Cl. .............. 307/279; 307/238; 307/247 A; 307/251
[51] Int. Cl.² ............. H03K 17/22; H03K 3/286; H03K 3/353
[58] Field of Search ...... 307/202, 238, 251, 247 R, 307/247 A, 279, 293, 296; 317/9 C, 36 R, 36 TD, 49; 340/365 E

[56] References Cited

UNITED STATES PATENTS

| | | | |
|---|---|---|---|
| 3,530,443 | 9/1970 | Crafts et al. ................. | 307/279 X |
| 3,593,036 | 7/1971 | Ma et al. ..................... | 307/247 A |
| 3,748,498 | 7/1973 | Hoffman ...................... | 307/279 |
| 3,753,011 | 8/1973 | Faggin ......................... | 307/279 X |
| 3,832,578 | 8/1974 | Nomiya et al. ............... | 307/279 |
| 3,902,082 | 8/1975 | Proebsting et al. ............ | 307/279 |

Primary Examiner—John S. Heyman
Assistant Examiner—Larry N. Anagnos
Attorney, Agent, or Firm—Craig & Antonelli

[57] ABSTRACT

An initial state-setting circuit wherein a malfunction preventing transistor is connected in series with an input transistor of a flip-flop, and is rendered conductive a short time after closure of a power supply switch. Even when noise arises immediately after the closure of the power supply, no malfunction due to the noise is induced, since the malfunction preventing transistor is not yet conductive.

10 Claims, 5 Drawing Figures

CIRCUIT FOR SETTING AN INITIAL STATE AFTER CONNECTION OF A POWER SUPPLY

BACKGROUND OF THE INVENTION

1. Field of the Invention

This invention relates to an initial state-setting circuit and, more particularly, to a circuit for setting the state of a memory circuit, such as a flip-flop circuit, to a predetermined state after closure of a power supply switch.

2. Description of the Prior Art

In digital equipment, such as electronic desk top calculators and digital measuring instruments, numerous memory circuits are employed. In using such equipment, it is necessary to set the contents of the memory circuit, e.g. a register, to predetermined contents or clear the memory circuit after closure of a power supply switch. The applicants of the present application have proposed circuits for automatically effecting the clear operation in the specifications of (Japanese) Patent Application No. 61980/1973, Patent Application No. 61982/1973 and Patent Application No. 78368/1973.

The automatic clear circuit employs a flip-flop circuit in which the charging time constant of the gate capacitor of one transistor is different from that of the gate capacitor of the other transistor, or in which the output potentials of respective inverter circuits during steady state are different from each other. That is, it employs an asymmetric flip-flop circuit. Since the flip-flop circuit is asymmetric, the initial state after the closure of the power supply switch can be normally set at a stable point on one side.

The automatic clear circuit, however, is not always perfect, and can cause a malfunction due to noise of from an input source of the flip-flop in some operations.

Brief Summary of the Invention

It is accordingly, a principal object of this invention to provide an initial state-setting circuit which is highly immune to noise at its input.

Another object of this invention is to provide a circuit which can set an initial state even when a power supply switch is closed again immediately after opening of the power supply switch.

In accordance with this invention, there is provided an initial state-setting circuit in which a malfunction preventing transistor is connected in series with an input transistor of a flip-flop and in which the malfunction preventing transistor is rendered conductive a short time after closure of a power supply switch. With this circuit, even when noise is generated on the input side, immediately after the closure of the power supply switch, the malfunction preventing transistor is nonconductive, and hence, the automatic clear operation is not hindered.

This invention and further objects thereof will become apparent from the ensuing description taken with reference to the drawing.

BRIEF DESCRIPTION OF THE DRAWING

FIG. 1 shows a circuit according to this invention for automatically setting the initial state after closure of a power supply switch, while

FIG. 3 shows another embodiment of the initial state-setting circuit according to this invention, while

DETAILED DESCRIPTION

Figure 1:
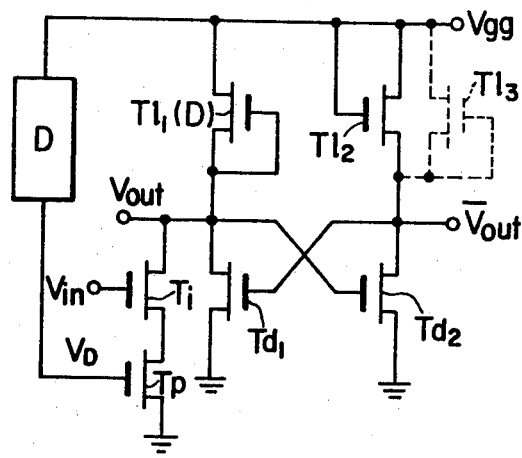

FIG. 1 shows an initial state-setting circuit according to this invention. In the figure, T designates an insulated gate field-effect transistor (hereinbelow shortly termed "transistor"). A suffix (D) indicates the transistor is of the depletion mode type, while a transistor designation without the suffix represents a transistor of the enhancement mode type.

$Tl_1(D)$ and $Tl_2$ represent load transistors and $Td_1$ and $Td_2$ drive transistors and the respective transistors are connected in pairs to form two inverter circuits. The outputs of the respective inverter circuits are mutually fed-back to the input sides of the opposite inverter circuits. These inverter circuits constitute the principal part of a flip-flop circuit.

$T_i$ indicates an input transistor of a flip-flop circuit. An input signal $V_{in}$ is applied to the gate of the input transistor $T_i$.

$T_p$ is a transistor for preventing a malfunction connected in series with the input transistor $T_i$ in accordance with this invention. The gate of the malfunction preventing transistor $T_p$ is connected through a delay circuit D to a voltage source $V_{gg}$.

The operation of the initial state-setting circuit will now be explained.

The flip-flop circuit composed of the transistor $Tl_1(D)$ $Tl_2$, $Td_1$ and $Td_2$ is an asymmetic flip-flop which employs an enhancement mode transistor as the load of one of the inverter circuits and a depletion mode transistor as the load of the other inverter circuit. Therefore, if the operation of the input side is disregarded, the state after closure of the power supply switch (connecting the power supply to the circuit) will be set to a predetermined state. More specifically, the absolute value of the output potential of the inverter circuit employing the depletion mode transistor builds up more abruptly than that of the other inverter circuit, so that transistor $Td_2$ becomes conductive earlier than transistor $Td_1$. Consequently, the state of the flip-flop after the closure of the power supply switch as represented by $\overline{V_{out}}$ is "1" (ground potential). The output signal $\overline{V_{out}}$ can be used as a clear signal of an electronic calculator and the like.

However, where the source of the input transistor $T_i$ is directly grounded, i.e., in the absence of the malfunction preventing transistor $T_p$, the initial state-setting circuit has been found to malfunction when noise (to be discussed later and explained with reference to FIGS. 3 and 4) occurs in the input signal $V_{in}$ immediately after the closure of the power supply switch. The reason is that, when the input transistor $T_i$ is rendered conductive by noise, the state of the flip-flop switches so that $\overline{V_{out}}$ becomes "0" (with $Td_2$ being nonconductive).

According to this invention, the transistor $T_p$ for preventing the malfunction is connected in series with the input transistor $T_i$, and this transistor $T_p$ remains nonconductive for a predetermined time owing to the delay circuit D immediately after the closure of the power supply switch. Therefore, even when noise appears at the output immediately after the closure of the power supply switch, the operation of setting the initial state of the flip-flop is not affected by input noise.

The malfunction preventing transistor $T_p$ is rendered conductive by the delay circuit d after sufficiently avoiding that period immediately subsequent to the closure of the power supply switch, in which the noise is prone to occur. Thereafter, the state of the flip-flop circuit can be controlled by the input signal $V_{in}$.

Figure 2A:
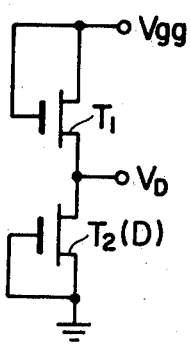
FIGS. 2a and 2b show specific examples of a delay circuit D employed therein.
Figure 2B:
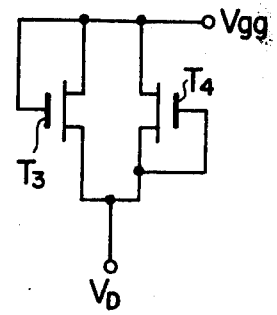

Specific constructions of the delay circuit D are shown in FIGS. 2a and 2b. In the delay circuit of FIG. 2a, transistor $T_1$ is nonconductive at the moment of the closure of the power supply switch to the voltage source $V_{gg}$, so that a voltage $V_D$ to be impressed on the transistor $T_p$ in FIG. 1 is at ground potential. When the voltage of the power supply $V_{gg}$ rises gradually and exceeds the treshold voltage of the transistor $T_1$, the transistor $T_1$ turns "on" for the first time and the voltage $V_D$ begins to rise from ground potential. In due course, the voltage $V_D$ becomes higher than the threshold voltage of the transistor $T_p$, and the transistor $T_p$ becomes conductive. The delay time until the conduction of the transistor $T_p$ is determined by the rise characteristic of the power supply $V_{gg}$, the threshold voltage and the mutual conductance of the transistor $T_1$, the input capacitance of the transistor $T_p$, etc.

A depletion mode transistor $T_2$ (D) is provided in order to instantly discharge charges, accumulated in the transistor $T_p$, at the disconnection of the power supply whereby the normal operation of automatically setting the initial state can be effected even when the power supply is connected again immediately after the disconnection. Instead of the transistor $T_2$ (D), an enhancement mode transistor $T_4$ may be used which is connected in parallel with a transistor $T_3$ as in FIG. 2b. For the same purpose, a transistor $Tl_3$ can also be employed for the flip-flop itself as shown in FIG. 1.

Although the initial state-setting circuit in FIG. 1 forms an asymmetic flip-flop by employing the two transistors of the different operation modes as the load transistors, the asymmetric flip-flop can alternatively be constructed by, for example, making the gate capacitance charging time constant or the threshold voltage of one of the driving transistors greater than that of the other driving transistor. By connecting another input transistor in parallel with the driving transistor $Td_2$, one can form an initial state-setting circuit in an RS flip-flop circuit conjointly with the transistors $T_i$ and $T_p$. A clear signal obtained by keying can be applied to the other input transistor. In this case, a transistor functioning like the transistor $T_p$ need not be added.

Figure 3:
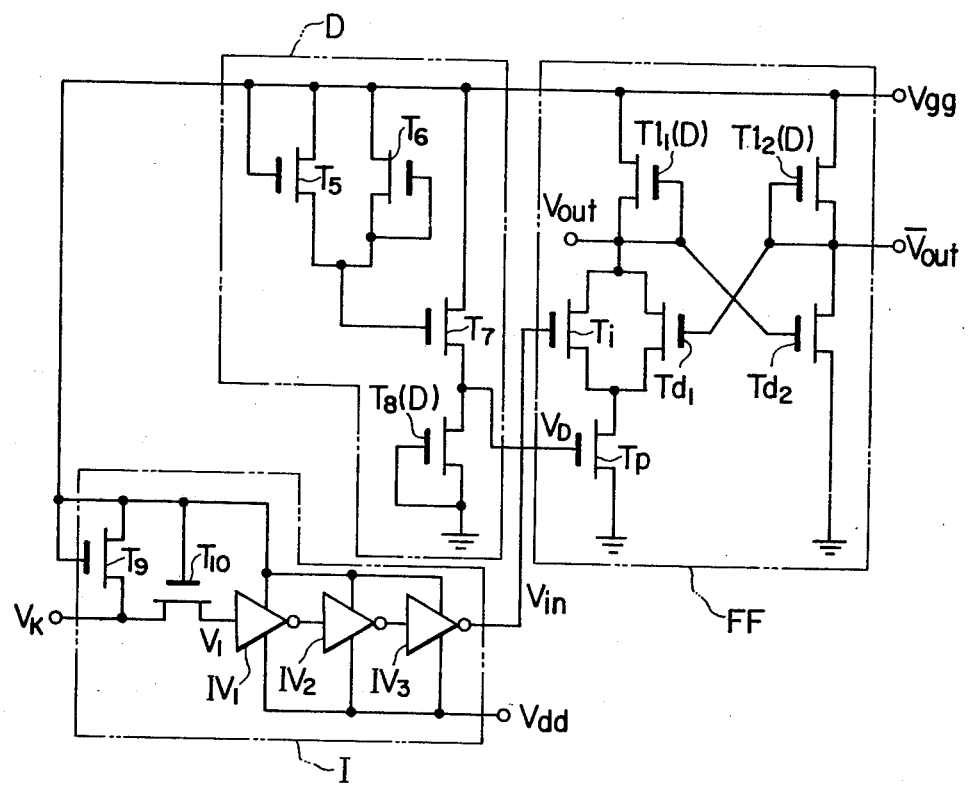
Figure 4:
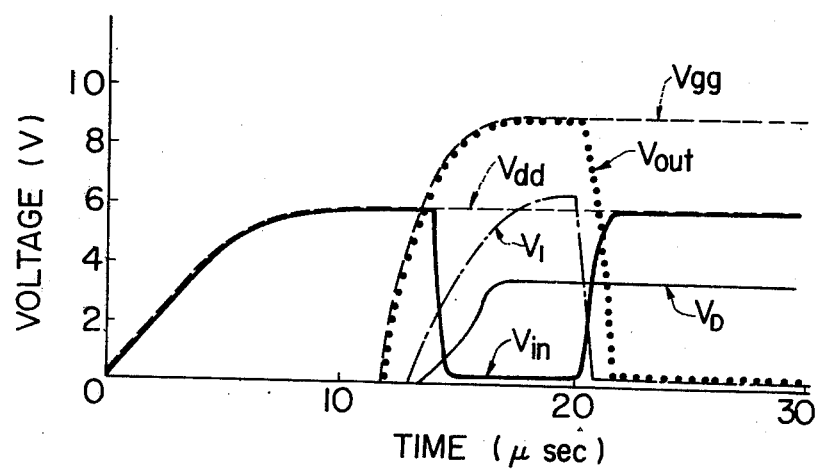
FIG. 4 is a time chart for explaining the operation thereof.

FIG. 3 is a diagram of an initial state-setting circuit according to this invention, while FIG. 4 is a time chart for explaining the operation of the circuit of FIG. 3.

The point of difference of the initial state-setting circuit of FIG. 3 from that of FIG. 1 is that an asymmetric flip-flop FF is constructed by connecting the malfunction preventing transistor $T_p$ in series with the driving transistor $Td_1$ of one inverter circuit. With the flip-flop, the transistor $T_p$ is in the nonconductive state for a short time after the closure of the power supply switch. It is, therefore, possible to perfectly bring the transistor $Td_2$ into the conductive state irrespective of the operation of the transistor $Td_1$ and to always set the initial state to $\overline{V_{out}} = 1$ (ground potential). That is, the transistor $T_p$ is used both for preventing a malfunction due to noise at the input and as one constituent of the asymmetric flip-flop for setting the initial state.

The delay circuit D differs from that of FIG. 2a in that one more stage made up of a transistor $T_7$ is connected between the power supply terminal $V_{gg}$ and the transistor $T_p$, to increase the period of time until the transistor $T_p$ becomes conductive. The reason why the delay time is increased is that the voltage $V_D$ to be impressed on the transistor $T_p$ builds up after the supply voltage $V_{gg}$ exceeds double the threshold voltage of the transistor. A transistor $T_6$ has the function of discharging charges, accumulated in the transistor $T_7$ immediately after the disconnection of the power supply.

Letter I designates an input circuit of the flip-flop FF, and its input terminal $V_k$ is connected to, for example, a key switch of an electric desk top calculator.

The input circuit I is used in order to release the automatic initial state initial operation of the flip-flop FF and to free the calculator from the clear state in the case where any key is depressed.

Transistor $T_9$ and $T_{10}$ are provided for "pull-up," which serve to feed a driving voltage to an inverter circuit $IV_1$ from the power supply $V_{gg}$ (about 9 V) when the key switch is kept free. When the key switch is kept depressed, the input of the inverter circuit $IV_1$ is substantially at ground potential. Inverter circuits $IV_1$ and $IV_2$ are used for correcting an input signal level from the key, that is, they are buffers, while an inverter circuit $IV_3$ is used for inverting the phase. The drains and gates of load transistors of these inverter circuits are respectively connected to a power supply $V_{dd}$ (about 6 V) and to the power supply $V_{gg}$ (about 9V).

The operation of the present circuit arrangement will now be explained with reference to FIG. 4.

The instant the power source switch of the calculator is closed, the power supply voltage $V_{dd}$ starts rising at once as indicated by a broken line in the figure, whereas the power supply voltage $V_{gg}$ starts rising approximately $12\mu$ sec later. The delay arises where the voltage source $V_{gg}$ is constructed by d.c.-boosting the voltage source $V_{dd}$, and this is the worst condition of the present circuit. In consequence, the input $V_1$ of the inverter circuit $IV_1$ starts rising with a further lag of about 1 $\mu$ sec as shown by a one-dot chain line. The delay time of 1 $\mu$ sec is a period which is required for the power supply $V_{gg}$ to exceed the threshold voltages of the transistors $T_9$, $T_{10}$ after beginning to rise. At this time, the key is not yet depressed. Consequently, the driving transistors of the inverter circuits $IV_1$, $IV_3$ are nonconductive until the input $V_1$ from the key reaches the threshold voltage thereof. As illustrated by a solid line, the waveform of the input $V_{in}$ of the flip-flop becomes one which extends along the waveform of the power supply $V_{dd}$.

Subsequently, when the input $V_1$ exceeds the threshold voltage, the states of the respective inverter circuits are inverted, and the input signal $V_{in}$ to the flip-flop FF starts falling upon a lapse of about $14\mu$ sec. Accordingly, the input signal $V_{in}$ is fed to the flip-flop FF as noise at the time of $14\mu$ sec after the closure of the power source. During this period, however, the malfunction preventing transistor $T_p$ is nonconductive because its gate potential $V_D$ is below the threshold voltage, as shown by the solid line in the figure. Accordingly, the flip-flop FF is not affected by the noise, and moreover, its initial state is set at $\overline{V_{out}} = 1$ (ground potential), i.e. $V_{out} = 0$ (about 9 V, indicated by a dotted line in the figure) by the operation of the malfunction preventing transistor $T_p$.

Thereafter, when the key switch is depressed (by way of example, upon a lapse of a period of time of 20 $\mu$ sec in the figure), the input $V_1$ starts falling and the input signal $V_{in}$ of the flip-flop rises again. Thus, the input transistor $T_i$ of the flip-flop becomes conductive. Since, at this time, the malfunction preventing transistor $T_p$ is already conductive with the gate potential $V_D$ being at steady state conditions (about 3.5V), the state of the flip-flop is inverted. That is, the flip-flop is released from the clear state.

The above explanation of the operation has been made on the basis of the setting of the worst condition — the power supply voltage $V_{gg}$ starts rising after the power supply voltage $V_{dd}$. However, even when the power supply voltage rise in the same manner, or when the circuit of FIG. 3 has a single power supply, noise can similarly arise in the input signal $V_{in}$ for some values of circuit constants.

In this way, the initial state-setting circuit explained in this invention can prevent the malfunction agaist the noises which appears immediately after the closure of the power supply.

We claim:

1. A circuit comprising:
   a first terminal to which a power supply voltage is to be applied;
   a second terminal to which a reference voltage is applied;
   first and second inverter circuits connected between said first and second terminals and including a first transistor and a second transistor, respectively, the respective outputs of said first and second transistors being connected to the respective inputs of the second and first transistors, thereby forming a flip-forming a flip-flop circuit;
   third and fourth transistors connected in series between the input of said second inverter circuit and said second terminal, and an input voltage being applied to said third transistor; and
   a delay circuit, connected between said first terminal and the input of said fourth transistor, for preventing said fourth transistor from being rendered conductive until a preselected period of time after the application of said power supply voltage to said first terminal.

2. A circuit comprising:
   a first terminal to which a power supply voltage is to be applied;
   a second terminal to which a reference voltage is applied;
   first and second inverter circuits connected between said first and second terminals, the respective outputs of which inverter circuits are connected to the inputs of the second and first inverter circuits, thereby forming a flip-flop circuit, each of said first and second inverter circuits comprising a driving transistor and a load transistor connected in series between said first and second terminals, the load transistor of said first inverter circuit being a depletion mode type field effect transistor and the load transistor of said second inverter circuit being an enhancement mode type field effect transistor;
   first and second transistors connected in series between the input of said second inverter circuit and said second terminal, and an input voltage being applied to said first transistor; and
   a delay circuit, connected between said first terminal and said second transistor, for preventing said second transistor from being rendered conductive until a preselected period of time after the application of said power supply voltage to said first terminal.

3. A circuit according to claim 2, wherein said driving transistors and said first and second transistors are enhancement mode type field effect transistors.

4. A circuit according to claim 2, wherein said delay circuit comprises a diode-connected enhancement mode type field effect transistor and a diode-connected depletion mode type field effect transistor connected in series between said first and second terminals and an output connected to said second transistor.

5. A circuit according to claim 2, wherein said delay circuit comprises a first diode-connected enhancement mode type field-effect transistor and a second diode connected enhancement mode transistor connected in parallel between said first terminal and said second transistor.

6. A circuit comprising:
   a first terminal to which a power supply voltage is to be applied;
   a second terminal to which a reference voltage is applied;
   first and second inverter circuits connected between said first and second terminals, the respective outputs of which inverter circuits are connected to the inputs of the second and first inverter circuits, thereby forming a flip-flop circuit, said second inverter circuit comprising a drive transistor and a load transistor connected in series between said first and second terminals;
   first and second transistors connected in series between the input of said second inverter circuit and said second terminal, and an input voltage being applied to said first transistor, said first inverter circuit comprising a driving transistor and a load transistor connected in series between said first terminal and the common connection of said first and second transistors; and
   a delay circuit, connected between said first terminal and said second transistor, for preventing said second transistor from being rendered conductive until a preselected period of time after the application of said power supply voltage to said first terminal.

7. A circuit according to claim 6, wherein the load transistors of said first and second inverter circuts are of the depletion mode type, while said driving transistors and said first and second transistors are of the enhancement mode type.

8. A circuit according to claim 7, wherein said delay circuit comprises a first delay stage of a pair of diode-connected enhancement mode type field effect transistors connected in parallel between said first terminal and the input of a second delay stage of a diode-connected enhancement mode type field effect transistor and a diode-connected depletion mode type field effect transistor connected in series between said first and second terminals, the common connection of the transistors of said second delay stage being connected to said second transistor.

9. A circuit according to claim 8, further comprising a third terminal to which a further power supply voltage is applied and an input circuit, having an input key terminal to which an input key potential is applied, connected between said power supply voltage terminals and said first transistor.

10. A circuit according to claim 9, wherein said input circuit comprises a plurality of inverter buffer stages connected in cascade to which said power supply voltages are coupled and an input control circuit for controlling the application of the power supply voltage applied to said first terminal to said inverter buffer stages, the output of said stages being connected to said first transistor.

* * * * *